(12) United States Patent
Kobayashi et al.

(10) Patent No.: US 9,362,085 B2
(45) Date of Patent: Jun. 7, 2016

(54) CHARGED-PARTICLE BEAM LITHOGRAPHIC SYSTEM

(71) Applicant: JEOL Ltd., Tokyo (JP)

(72) Inventors: Noriyuki Kobayashi, Tokyo (JP); Yoshiaki Takizawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 7 days.

(21) Appl. No.: 14/624,881

(22) Filed: Feb. 18, 2015

(65) Prior Publication Data

US 2015/0303027 A1 Oct. 22, 2015

(30) Foreign Application Priority Data

Feb. 25, 2014 (JP) .................................. 2014-34116

(51) Int. Cl.
*H01J 37/20* (2006.01)
*H01J 37/317* (2006.01)
(52) U.S. Cl.
CPC ............. *H01J 37/20* (2013.01); *H01J 37/3175* (2013.01)
(58) Field of Classification Search
CPC ....... H01J 37/20; H01J 37/28; H01J 37/3171; H01J 37/3174; H01J 37/3175; H01J 37/3177
See application file for complete search history.

(56) References Cited

U.S. PATENT DOCUMENTS

| 5,912,468 | A | * | 6/1999 | Hirano | ................... | B82Y 10/00 |
| | | | | | | 250/398 |
| 7,633,303 | B2 | * | 12/2009 | Furukawa | ............ | G01R 31/307 |
| | | | | | | 324/754.22 |
| 9,299,531 | B2 | * | 3/2016 | Asami | ................. | H01J 37/3002 |
| 2008/0054195 | A1 | * | 3/2008 | Tachikawa | ............. | B82Y 10/00 |
| | | | | | | 250/492.22 |

FOREIGN PATENT DOCUMENTS

| JP | 200743078 A | 2/2007 |
| JP | 200858809 A | 3/2008 |

* cited by examiner

*Primary Examiner* — Jack Berman
*Assistant Examiner* — David E Smith
(74) *Attorney, Agent, or Firm* — The Webb Law Firm

(57) ABSTRACT

A charged-particle beam lithographic system (100) delineates a pattern on a substrate (2) by directing a charged-particle beam (L) at the substrate. The system (100) includes a substrate stage (10) on which the substrate (2) is disposed and a substrate cover (20). The cover (20) has a frame portion (22) that covers an outer peripheral portion of the substrate (2) as viewed within a plane. The frame portion (22) has a first part (22*a*) disposed on the stage (10) and a second part (22*b*) capable of being loaded and unloaded on and from the stage (10) by a transport portion (40). When the second part (22*b*) is loaded on the stage (10), it is electrically grounded.

7 Claims, 16 Drawing Sheets

CHARGED-PARTICLE BEAM LITHOGRAPHIC SYSTEM

BACKGROUND OF THE INVENTION

1. Field of the Invention

The present invention relates to a charged-particle beam lithographic system.

2. Description of Related Art

A charged-particle beam lithographic system is equipment for writing ultrafine patterns such as semiconductor integrated circuit patterns on substrates such as semiconductor substrates and mask blanks using a charged particle beam such as an electron beam.

A variable-shaped (variable-area) charged-particle beam lithographic system is disclosed as one type of charged-particle beam lithographic system, for example, in JP-A-2007-43078. The operation of this disclosed system is described. An electron beam emitted from an electron gun illuminates a whole first aperture having a square hole via an illumination lens. First, the electron beam is shaped into a square form. The electron beam of the first aperture image passed through the first aperture is projected onto a second aperture via a projector lens. The position of the first aperture image on the second aperture is controlled by a deflector. The shape and dimensions of the beam can be varied. The electron beam of the second aperture image passed through the second aperture is focused by an objective lens, deflected by another deflector, and projected at a desired position on a sample lying on an X-Y stage that is disposed movably. In this case, it follows that the illuminating electron beam is rectangularly shaped in conformity with the pattern shape using a shot size less than a set maximum shot size.

A mask blank to be lithographically written is generally configured including a glass base, a light-shielding film layer made of Cr or other material and formed on the glass base, and a resist layer formed on the light-shielding film layer. This mask blank is mounted on a stage using a clamping mechanism or the like within a charged-particle beam lithographic system. Lithography is performed using an electron beam. During this lithography, if a part of the electron beam hits the side surface of the mask blank, then the glass base will be electrostatically charged. This in turn deviates the orbit of the electron beam.

Accordingly, a charged-particle beam lithographic system set forth in JP-A-2008-58809 uses a substrate cover including a frame-like member that is so sized that its outer periphery is located outside the outer periphery of a substrate. The frame-like member has a central opening having dimensions smaller than the outer size of the substrate. This cover shields the side surface of the substrate from the charged particle beam.

The substrate cover set forth in patent document 2 is mounted on a substrate. When the substrate is exchanged, the substrate cover is conveyed into the system together with the substrate and mounted on a stage. After the end of a lithography operation, the substrate cover is removed from the stage together with the substrate and taken out of the system. However, the substrate cover has an outer size greater than the outside dimension of the substrate and, therefore, it is difficult to convey the substrate cover by a transport device such as a robot arm or to mount the cover onto the stage by the transport device. As a result, the productivity is deteriorated. A structure having a substrate cover that is not mounted on a substrate is also conceivable. In this case, the substrate is first conveyed and mounted on a stage. Then, the substrate cover is conveyed to overlap the substrate and mounted on the stage. After the end of a lithography operation, the substrate cover is first removed from the stage and then the substrate is removed and conveyed out of the system. Again, the substrate cover that is larger in size than the substrate must be conveyed using a transport device. The productivity is deteriorated for a similar reason.

SUMMARY OF THE INVENTION

In view of the foregoing problems, the present invention has been made. One object associated with some aspects of the present invention is to provide a charged-particle beam lithographic system capable of providing improved productivity. Another object associated with some aspects of the invention is to provide a substrate cover capable of providing enhanced productivity.

(1) A charged-particle beam lithographic system associated with the present invention is adapted to delineate a pattern on a substrate by directing a charged particle beam at the substrate. The charged-particle beam lithographic system has: a substrate stage on which the substrate is placed; and a substrate cover having a frame portion that covers an outer peripheral portion of the substrate as viewed within a plane. The frame portion has a first part disposed on the substrate stage and a second part capable of being loaded and unloaded on and from the substrate stage by a transport portion. The second part is electrically grounded when loaded on the substrate stage.

In this charged-particle beam lithographic system, the substrate cover has the frame portion that covers an outer peripheral portion of a substrate as viewed within a plane. Therefore, when a pattern is delineated on the substrate by irradiating the substrate with a charged particle beam, the side surface of the substrate can be shielded from the charged particle beam. Consequently, in this charged-particle beam lithographic system, the substrate can be suppressed from being electrostatically charged due to irradiation by the charged particle beam.

In this charged-particle beam lithographic system, the frame portion has the second part that can be loaded and unloaded on and from the substrate stage, as well as the first part. The second part is loaded and unloaded by the transport portion. Therefore, in this charged-particle beam lithographic system, the frame portion can be loaded and unloaded with more ease than where the whole frame portion is loaded and unloaded, for example, by the transport portion. Consequently, the frame portion can be loaded and unloaded in shorter times. This leads to improved productivity.

(2) In one feature of this charged-particle beam lithographic system, a conductive first pin that makes mechanical and electrical contact with the substrate is mounted on the second part. The substrate may be electrically connected with the first pin and grounded.

In this charged-particle beam lithographic system, the conductive first pin can suppress the substrate from being electrostatically charged. Furthermore, in this lithographic system, the second part of the frame portion of the substrate cover can be easily loaded and unloaded easily by the transport portion. Therefore, dust adhering to the conductive first pin can be easily removed by conveying the second part out of the system and rubbing the first pin against the substrate. Consequently, this charged-particle beam lithographic system can provide enhanced productivity.

(3) In another feature of this charged-particle beam lithographic system, a conductive second pin that makes mechanical and electrical contact with the substrate may be mounted on the second part and electrically insulated from the second part. The conductive second pin may be connected with a detector for detecting that the substrate is electrically grounded.

In this charged-particle beam lithographic system, it is easy to check that the substrate is electrically grounded.

(4) In a further feature of this charged-particle beam lithographic system, the substrate may have a first surface with which the conductive first pin makes contact and a second surface facing away from the first surface. Plural clamping portions for holding the substrate may be mounted on the substrate stage and push against the substrate from a side of the second surface. The conductive first pin may be so placed that the distance between the first pin and a first one of the clamping portions is smaller than the distance between the first pin and each of the other clamping portions. The first clamping portion may apply a greater pushing force to the substrate than the other clamping portions.

In this charged-particle beam lithographic system, forces applied to the substrate can be made more uniform than where plural clamping portions apply pushing forces of the same magnitude. Hence, the substrate can be suppressed from being flexed.

(5) In an additional feature of this charged-particle beam lithographic system, the second part may have a vibratory portion for vibrating the second part.

In this charged-particle beam lithographic system, residual stress produced between each member (such as the clamping portion) for securing the substrate on the substrate stage and the substrate can be reduced. Accordingly, in this lithographic system, positional deviation of the substrate on the substrate stage can be suppressed.

(6) In a still other feature of this charged-particle beam lithographic system, the vibratory portion may have an eccentric weight and a motor for rotating the weight.

In this charged-particle beam lithographic system, the second part of the frame portion can be vibrated.

(7) In a yet other feature of this charged-particle beam lithographic system, the vibratory portion may have a piezoelectric device.

In this charged-particle beam lithographic system, the second part of the frame portion can be vibrated. Furthermore, in this lithographic system, a weaker magnetic field can be produced than where the vibratory portion uses a motor.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

Figure 1:
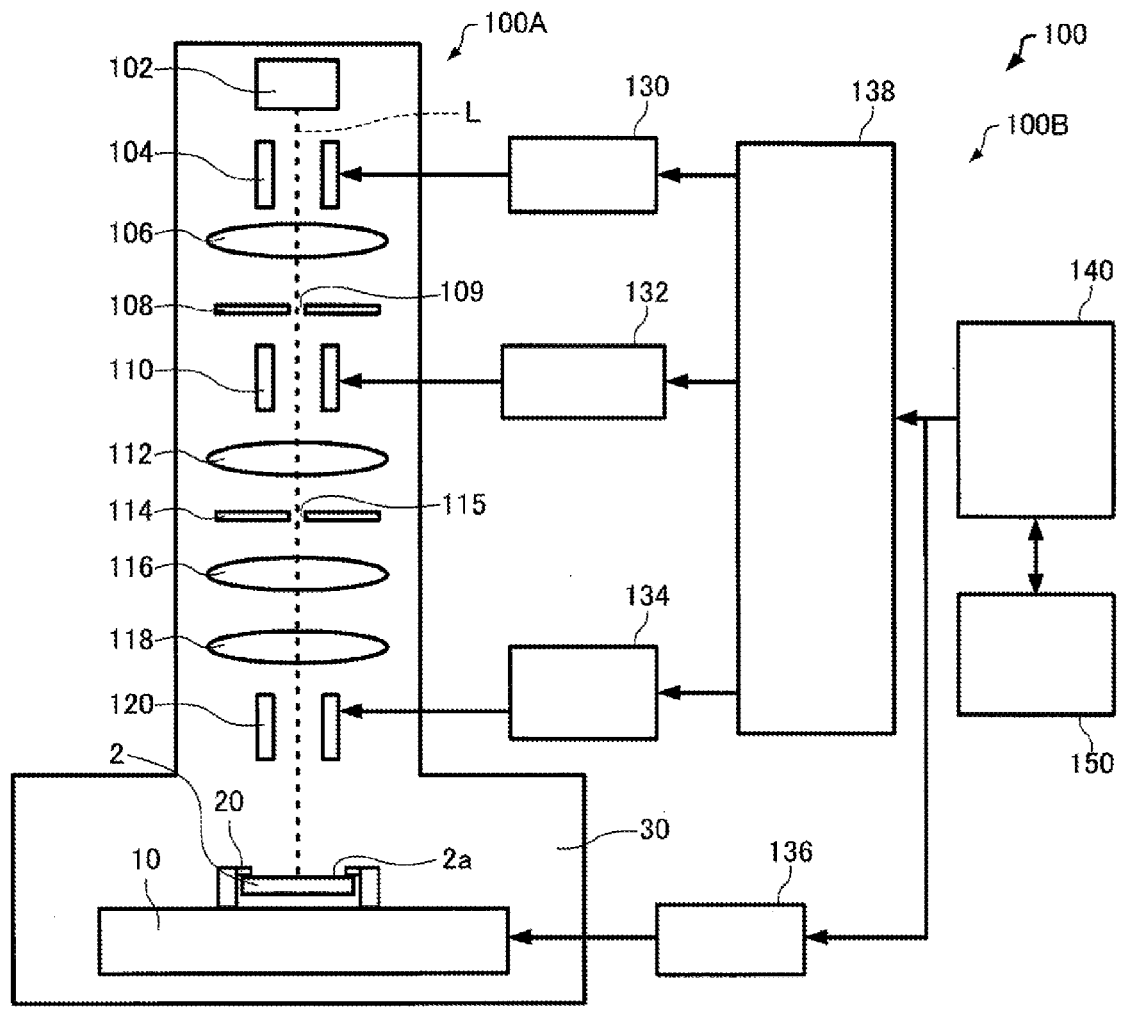
FIG. 1 is a schematic side elevation, partly in block form, of a charged-particle beam lithographic system associated with a first embodiment of the present invention.

1. First Embodiment 1.1. Configuration of Charged-Particle Beam Lithographic System A charged-particle beam lithographic system, 100, associated with a first embodiment of the present invention is first described by referring to FIG. 1, which schematically shows the configuration of the system 100. In FIG. 1, for the sake of convenience, a substrate stage 10 and a substrate cover 20 are shown in simplified form.

The charged-particle beam lithographic system 100 is used to write pattern on a substrate 2 by directing a charged particle beam at the substrate. The charged particle beam referred to herein is made of charged particles and includes an electron beam and an ion beam. The substrate 2 can be a mask blank or a semiconductor substrate (such as a silicon substrate).

As shown in FIG. 1, the charged-particle beam lithographic system 100 includes the substrate stage 10, the substrate cover 20, an electron optical column 100A, and a control section 100B. In the following, an example is given in which the charged-particle beam lithographic system 100 writes a pattern on the substrate 2 by directing an electron beam L at the substrate.

The electron optical column 100A includes an electron gun (i.e., a charged particle beam source) 102, a beam blanker 104, an illumination lens 106, a first slit 108, a shaping deflector 110, a shaping lens 112, a second slit 114, a demagnification lens 116, an objective lens 118, and a positioning deflector 120.

The electron gun 102 emits the electron beam L. In this example, the electron gun producing the electron beam L is shown as one example of a charged particle beam source. No restriction is placed on the charged particle beam source as long as it can generate charged particles such as ionized atoms. The electron beam L released from the electron gun 102 has high current density.

The beam blanker 104 receives the blanking signal from a blanker control circuit 130, deflects the electron beam L, and adjusts the time for which the beam L passes through a first opening 109 of the first slit 108. That is, the blanker 104 can adjust the shot dose. The electron beam L passed through the blanker 104 is made to fall on the first slit 108 via the illumination lens 106.

The first slit 108 has the first opening 109. The second slit 114 has a second opening 115. The openings 109 and 115 are through-holes used to shape the electron beam L. For example, the openings 109 and 115 are of square cross section. No restriction is imposed on the cross-sectional shape of the openings 109 and 115. The shape may also be a rectangle, circle, ellipse, or polygon.

The shaping deflector 110 is located between the first slit 108 and the second slit 114. The shaping deflector 110 receives a drive signal from a shaping deflector drive circuit 132 and deflects the electron beam L passed through the first opening 109. The beam L deflected by the deflector 110 is made to impinge on the second slit 114 via the shaping lens 112.

An opening image created by the first opening 109 of the first slit 108 is focused onto the second opening 115 of the second slit 114 by the shaping lens 112. The position of the opening image on the second slit 114 can be varied by the shaping deflector 110.

In the charged-particle beam lithographic system 100, the shape of the shot beam (the cross-sectional shape of the electron beam L directed at the top surface 2a of the substrate 2 in the illustrated example) and the shot size (i.e., the cross-sectional area of the electron beam L hitting the writing surface) can be controlled by shaping the beam L by the first slit 108, shaping deflector 110, shaping lens 112, and second slit 114. That is, the charged-particle beam lithographic system 100 is a variable-shaped charged-particle beam lithographic system.

The demagnification lens 116 demagnifies the cross section of the electron beam L passed through the second opening 115 of the second slit 114. The objective lens 118 focuses the electron beam L emerging from the demagnification lens 116. The positioning deflector 120 can vary the position of the electron beam L on the substrate 2 in response to a drive signal from a positioning deflector drive circuit 134.

The substrate stage 10 is mounted in a lithography chamber 30 which is maintained, for example, at subatmospheric pressure. The substrate 2 is placed over the substrate stage 10, which in turn can move the substrate 2 into a given position. The substrate cover 20 is disposed over the substrate 2 placed over the stage 10. Details of the stage 10 and substrate cover 20 will be described later in "1.2. Substrate Stage and Substrate Cover".

The control section 100B includes the blanker control circuit 130, the shaping deflector drive circuit 132, the positioning deflector drive circuit 134, a stage drive circuit 136, a data transfer circuit 138, a control unit 140, and a storage device 150.

The control unit 140 transfers pattern data stored in the storage device 150 to the data transfer circuit 138. The control unit 140 operates as a computer by executing control programs stored in the storage device by means of a CPU (central processing unit) and performs the above-described processing and various control operations.

The storage device 150 acts as a working area for the control unit 140. The function of the storage device 150 can be implemented by a RAM or the like. The storage device 150 stores programs, data, and other related information permitting the control unit 140 to perform various kinds of computational processing and control operations. For example, the storage device 150 stores pattern data. Furthermore, the storage device 150 is used as a working area for the control unit 140. The control unit 140 is also used to temporarily store the results of computations executed in accordance with various programs.

The data transfer circuit 138 divides the pattern data into data sets each representing a part of a beam shape which is less than the maximum beam dimension. The transfer circuit 138 then sends the data sets to the shaping deflector drive circuit 132 and to the positioning deflector drive circuit 134. In response to the data sets representing the beam shape, the shaping deflector drive circuit 132 drives the shaping deflector 110, and the positioning deflector drive circuit 134 drives the positioning deflector 120.

Furthermore, the data transfer circuit 138 calculates shot time data from the pattern data and supplies the shot time data to the blanker control circuit 130. The blanker control circuit 130 supplies a blanking signal to the beam blanker 104, based on the shot time data from the data transfer circuit 138, to control cutoff of the illuminating electron beam L.

In this way, in the charged-particle beam lithographic system 100, the cross section of the electron beam L is shaped into a plurality of pattern segments by the shaping deflector 110, based on the pattern data. The substrate 2 is irradiated with the electron beam for a shot time controlled by the beam blanker 104, the cross section of the beam being represented by the pattern segments, to delineate a pattern of a desired shape.

When a different area on the substrate 2 is lithographically written, a control signal is supplied from the control unit 140 to the stage driver circuit 136 to move the substrate stage 10 for a given distance. The distance traveled by the stage 10 is being monitored by a laser metrology tool (not shown). The position of the stage 10 can be precisely controlled, based on the results of measurements performed by the laser metrology tool.

1.2. Substrate Stage and Substrate Cover

Figure 2:
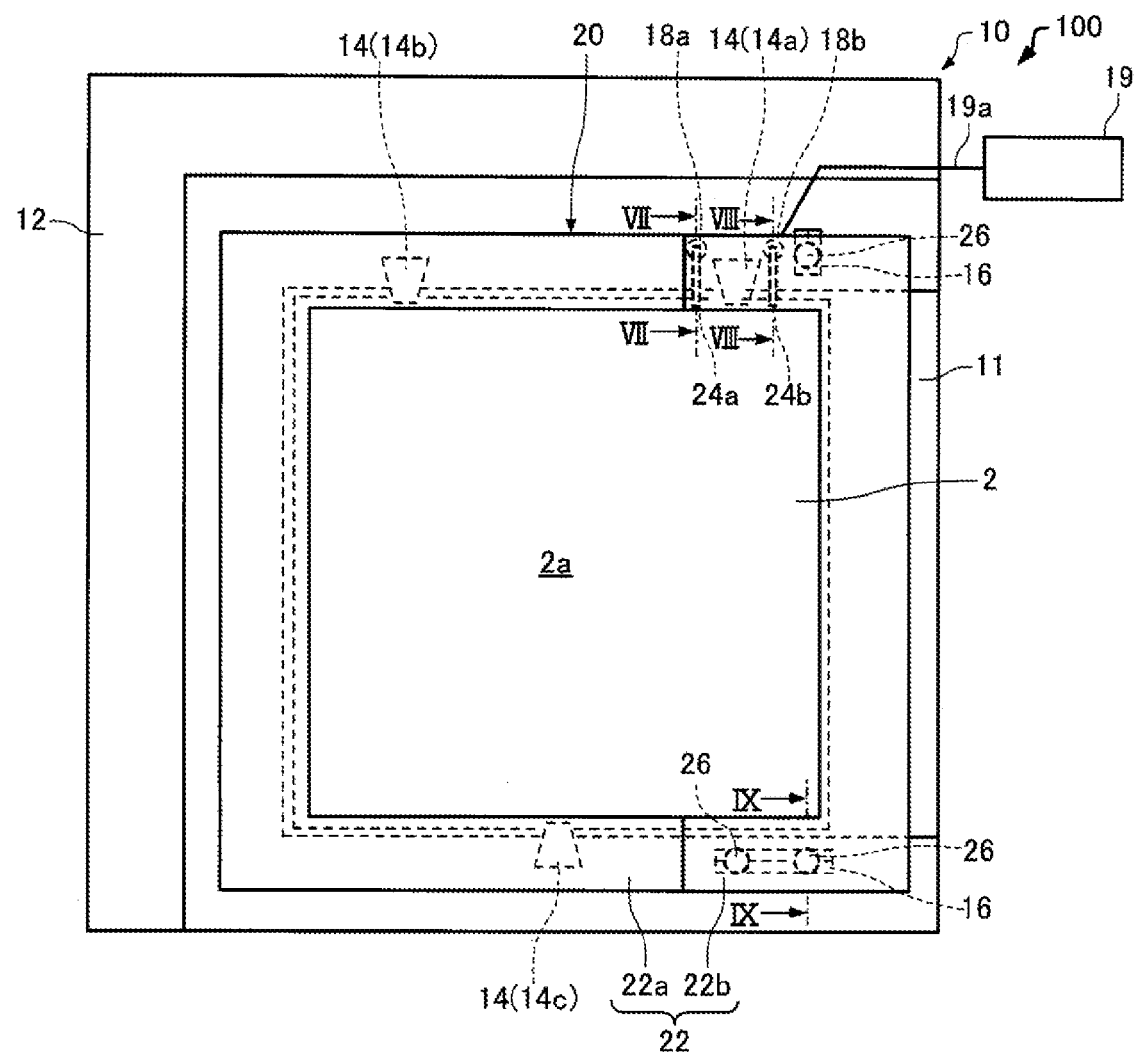
FIGS. 2 and 3 are schematic plan views of a substrate stage and a substrate cover of the charged-particle beam lithographic system shown in FIG. 1, showing different states.
Figure 3:
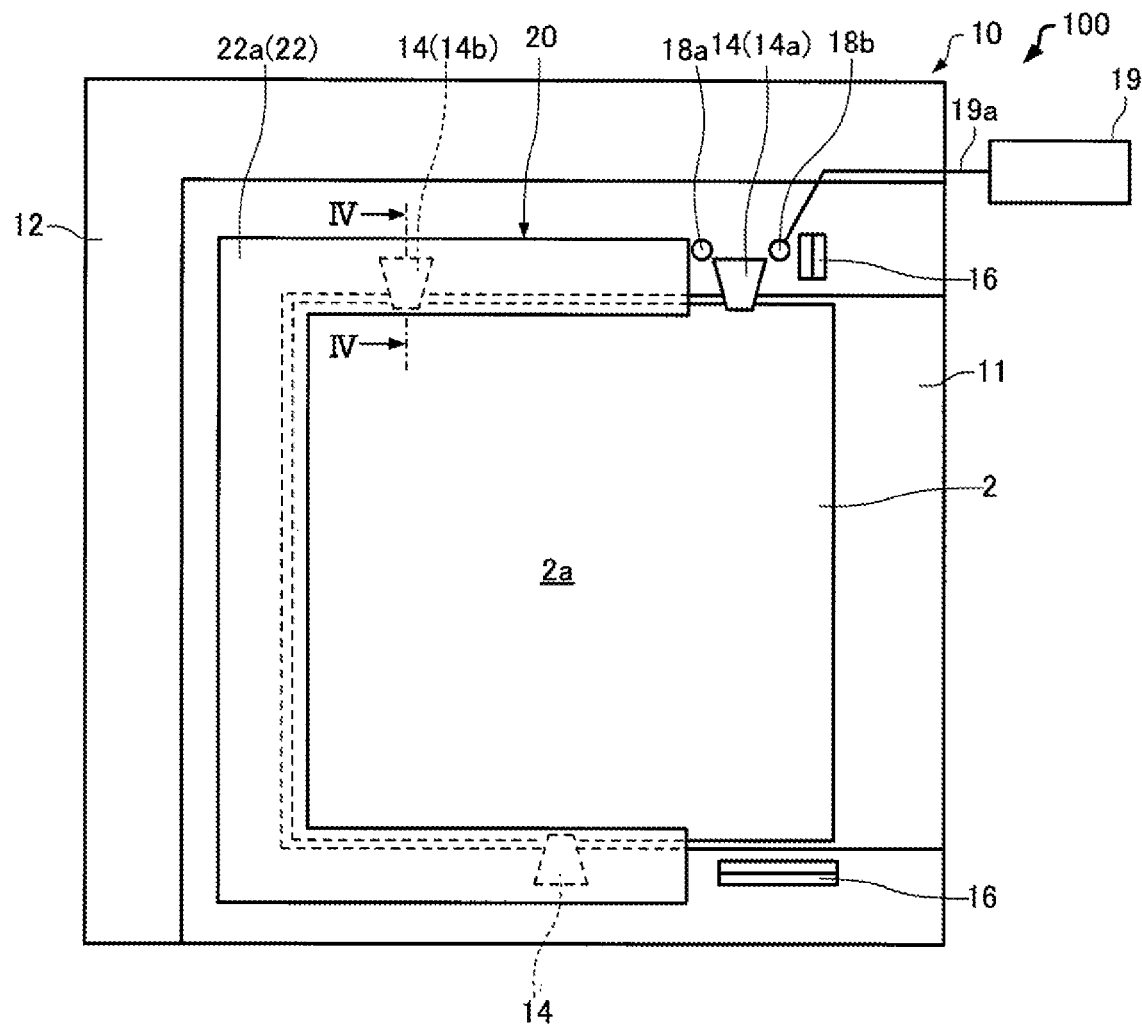

The substrate stage 10 and substrate cover 20 of the charged-particle beam lithographic system 100 are next described by referring to FIGS. 2 and 3, which are schematic plan views of the stage 10 and cover 20. FIG. 2 shows a state in which a second part 22b of a frame portion 22 of the substrate cover 20 has been mounted on the stage 10. FIG. 3 shows a state in which the second part 22b of the frame portion 22 of the cover 20 has been removed from the stage 10.

As shown in FIGS. 2 and 3, the sample stage 10 has a base portion 11, a mirror 12, clamping portions 14, positioning grooves 16, and terminals 18a, 18b. The base portion 11 is made of an electrically conductive material such as copper (Cu) or titanium (Ti). The base portion 11 is electrically connected to chassis ground of the body (not shown) of the system.

The mirror 12 is mounted over the base portion 11. The mirror 12 permits the position of the stage 10 to be measured by the laser metrology tool (not shown). The mirror 12 reflects laser light coming from the laser metrology tool.

Figure 4:
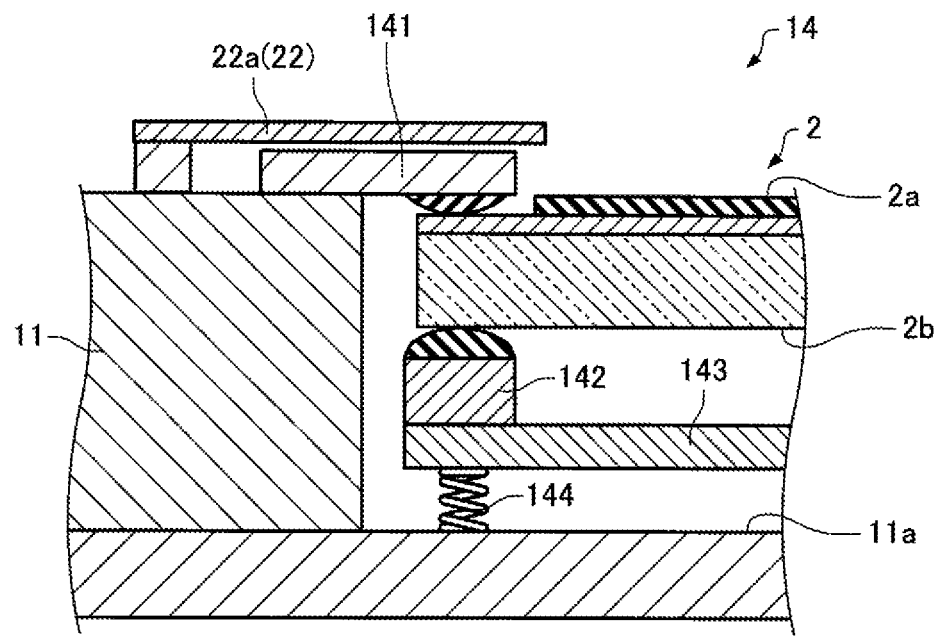
FIG. 4 is a schematic fragmentary cross-sectional view of clamping portions of the charged-particle beam lithographic system shown in FIG. 1.

The clamping portions 14 are mounted on the base portion 11 of the substrate stage 10, and act to hold the substrate 2. FIG. 4 is a cross-sectional view taken on line IV-IV of FIG. 3, schematically showing one clamping portion 14.

As shown in FIG. 4, each of the clamping portions 14 includes an upper member 141, a lower member 142, a plate-like member 143, and a pushing part 144. The substrate 2 is sandwiched and held between the upper member 141 and the lower member 142 of each clamping portion 14. The upper member 141 is fixedly secured to the base portion 11 and restricts the position of the top surface (may also be referred to as the first surface) 2a of the substrate 2. The lower member 142 is mounted on the plate-like member 143. The lower member 142 is pushed against the lower surface (may also be referred to as the second surface) 2b of the substrate 2 by the pushing part 144 mounted under the plate-like member 143, the second surface 2b facing away from the first surface. For example, the pushing part 144 is made of a spring. The base portion 11 is provided with a recessed portion having a bottom surface 11a on which the pushing part 144 is mounted. As shown in FIG. 3, the recessed portion of the base portion 11 extends to one end of the stage in the direction in which the substrate 2 is inserted (to the right as viewed in FIG. 3).

When the substrate 2 is clamped to the clamping portions 14, the plate-like member 143 is first lowered to move the lower member 142 and the pushing part 144 downwardly. The substrate 2 is then placed in position, and the downward force applied to the plate-like member 143 is ceased. As a result, the force of the pushing part 144 causes the upper member 141 and the lower member 142 to clamp the substrate 2 therebetween.

The clamping portions 14 are plural in number. In the illustrated example, there are three clamping portions 14 including a first clamping portion 14a, a second clamping portion 14b, and a third clamping portion 14c.

A conductive first pin 24a and a conductive second pin 24b are mounted to the second part 22b of the frame portion 22. As shown in FIG. 2, when the second part 22b of the frame portion 22 is mounted to the substrate stage 10, the first pin 24a is so positioned that the distance between the first pin 24a and the first clamping portion 14a out of the plural clamping portions 14a-14c is smaller than the distance between the first pin 24a and any one of the other clamping portions 14b and 14c as viewed within a plane (i.e., as viewed from the upstream side relative to the direction of the electron beam L). Similarly, when the second part 22b of the frame portion 22 is mounted to the substrate stage 10, the conductive second pin 24b is so positioned that the distance between this second pin 24b and the first clamping portion 14a is smaller than the distance between the second pin 24b and any one of the other clamping portions 14b and 14c as viewed within a plane. Preferably, the conductive first and second pins 24a, 24b are located close to the first clamping portion 14a.

The pushing part 144 of the first clamping portion 14a applies a greater pushing force to the lower surface 2b of the substrate 2 than the pushing part 144 of any one of the other clamping portions 14b, 14c. In particular, the force applied by the pushing part 144 of the first clamping portion 14a is greater than the pushing force applied by each of the other clamping portions 14b and 14c by an amount corresponding to the sum of the force applied to the top surface 2a of the substrate 2 by the conductive first pin 24a and the pushing force applied to the top surface 2a of the substrate 2 by the conductive second pin 24b. This can make uniform the forces applied to the substrate 2, thus suppressing flexure of the substrate 2.

The positioning grooves 16 are formed in the base portion 11 as shown in FIGS. 2 and 3 to place the second part 22b of the frame portion 22 in position. Since positioning members 26 mounted under the second part 22b of the frame portion 22 are disposed in the positioning grooves 16, the second part 22b of the frame portion 22 can be placed in position. In the illustrated example, the positioning grooves 16 are two in number.

The terminals 18a and 18b are attached to the base portion 11. When the second part 22b of the frame portion 22 is mounted to the substrate stage 10 as shown in FIG. 2, the terminal 18a comes into contact with the conductive first pin 24a mounted on the second part 22b of the frame portion 22. When the second part 22b of the frame portion 22 is mounted on the stage 10, the terminal 18b comes into contact with the conductive second pin 24b mounted on the second part 22b of the frame portion 22. The terminal 18b is electrically connected via a wiring line 19a with a detector 19 made of a resistance measuring device.

As shown in FIG. 2, the substrate cover 20 has the frame portion 22, conductive first pin 24a, conductive second pin 24b, and positioning members 26. The frame portion 22 covers an outer peripheral portion of the substrate 2 as viewed within a plane as shown in FIG. 2. The frame portion 22 is made of a plate-like member centrally provided with an opening. The frame portion 22 has an outer peripheral portion larger than the outer peripheral portion of the substrate 2. The opening of the frame portion 22 is smaller in size than the outer peripheral portion of the substrate 2. Therefore, when the substrate cover 20 is laid over the substrate 2 as shown in FIG. 2, the whole outer peripheral portion of the substrate 2 overlaps the frame portion 22. The frame portion 22 is made, for example, of a conductive material. Alternatively, the frame portion 22 may have a front surface made of an insulating material coated with a conductive material. The conductive material can be a metal such as copper (Cu), titanium (Ti), or an alloy thereof. The insulating material can be a ceramic material.

The frame portion 22 has a first part 22a and the second part 22b which together form a frame-like structure on the stage 10 and cover the outer peripheral portion of the substrate 2 as viewed within a plane. As shown in FIG. 2, the frame portion 22 has an outer fringe portion in the form of a square as viewed within a plane. The frame portion 22 is divided into the first part 22a and the second part 22b by partitioning the square with a virtual straight line which is parallel to one side of the square and which passes off the center of the square. The area of the first part 22a is larger than the area of the second part 22b as viewed within a plane.

The frame portion 22 has an outer fringe portion in the form of a square as viewed within a plane in an unillustrated manner. The frame portion 22 may be divided into the first part 22a and the second part 22b which are equal in area as viewed within a plane by partitioning the square with a virtual straight line which is parallel to one side of the square and which passes through the center of the square. In the present example, the frame portion 22 has the two parts, 22a and 22b. Alternatively, the frame portion 22 may have more than two parts.

The first part 22a of the frame portion 22 is disposed on the substrate stage 10, and is mounted on the base portion 11 so as to surround the substrate 2. In particular, as shown in FIG. 4, the first part 22a is fixedly secured to a frame which is mounted to the base portion 11.

Figure 5:
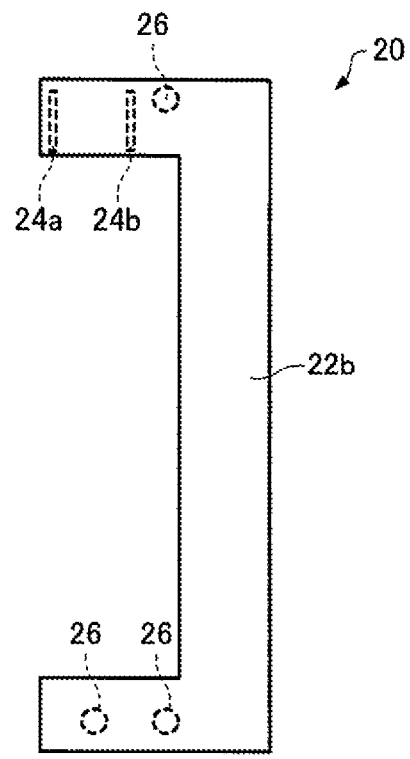
FIG. 5 is a schematic plan view of a second part of a frame portion of the substrate cover shown in FIGS. 2 and 3.
Figure 6:
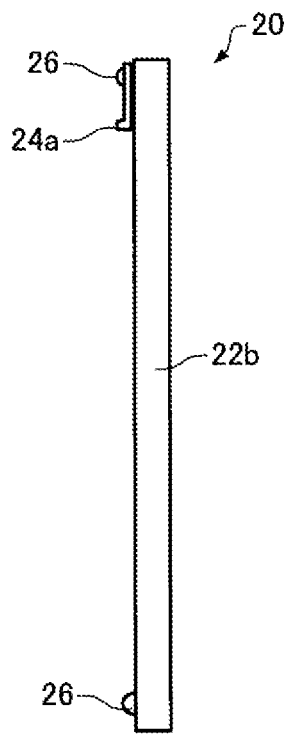
FIG. 6 is a schematic side elevation of the second part of the frame portion of the substrate cover shown in FIG. 5.

FIG. 5 is a schematic plan view of the second part 22b of the frame portion 22. FIG. 6 is a schematic side elevation of the second part 22b of the frame portion 22. The second part 22b of the frame portion 22 can be loaded and unloaded on and from the substrate stage 10. That is, the second part 22b of the frame portion 22 can be attached and detached to and from the stage 10 using a transport portion 40 (see FIG. 11).

The conductive first pin 24a and the conductive second pin 24b are mounted on the second part 22b of the frame portion 22. However, these pins 24a and 24b are not mounted on the first part 22a of the frame portion 22. The conductive pins 24a and 24b are made of a conductive material such as a metal.

Figure 7:
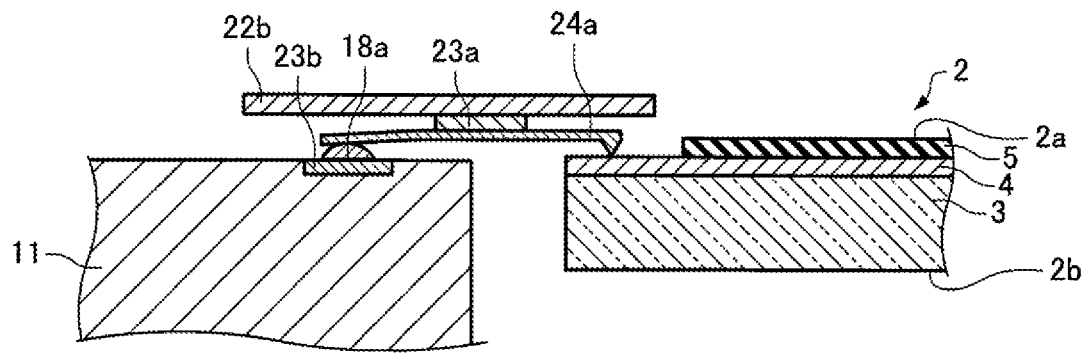
FIGS. 7 and 8 are schematic fragmentary cross-sectional views of the substrate stage and substrate cover shown in FIGS. 2 and 3.

FIG. 7 is a schematic cross-sectional view of the substrate stage 10 and the substrate cover 20, taken on line VII-VII of FIG. 2. When the second part 22b of the frame portion 22 is mounted over the substrate stage 10 as shown in FIG. 7, the conductive first pin 24a comes into contact with the top surface 2a of the substrate 2 and is electrically connected with this top surface 2a. As shown in FIG. 7, the substrate 2 has a base plate 3 of glass, a light shielding film layer 4 formed on the glass base plate 3, and a resist layer 5 formed on the light shielding film layer 4. The light shielding film layer 4 is made, for example, of chromium (Cr). In the illustrated example, the resist layer 5 is not formed over the outer peripheral portion of the substrate 2 and so the light shielding film layer 4 is exposed.

When the second part 22b of the frame portion 22 is mounted over the substrate stage 10, the front end of the conductive first pin 24a comes into contact with the exposed, light shielding film layer 4 as shown in FIG. 7. The rear end of the conductive first pin 24a comes into contact with the terminal 18a. The conductive first pin 24a is connected with the second part 22b of the frame portion 22 via a conductive member 23a. The terminal 18a is mounted on the base portion 11 via a conductive member 23b. Therefore, when the second part 22b of the frame portion 22 is mounted over the substrate stage 10, the conductive first pin 24a is electrically connected with the substrate cover 20 and with the base portion 11. Since the base portion 11 is connected to chassis ground of the body of the system, the light shielding film layer 4 in contact with the conductive first pin 24a is grounded. In this way, when the second part 22b of the frame portion 22 is mounted over the substrate stage 10, the substrate 2 (light shielding film layer 4) is electrically connected with the conductive first pin 24a and grounded.

In the above embodiment, the second part 22b of the frame portion 22 is grounded by grounding the conductive first pin 24a via the terminal 18a. Since the second part 22b of the frame portion 22 can be grounded by connecting the second part with the base portion 11 via the positioning members 26 as described later, grounding via the terminal 18a is not essential. The terminal 18a and conductive member 23b may be omitted.

Figure 8:
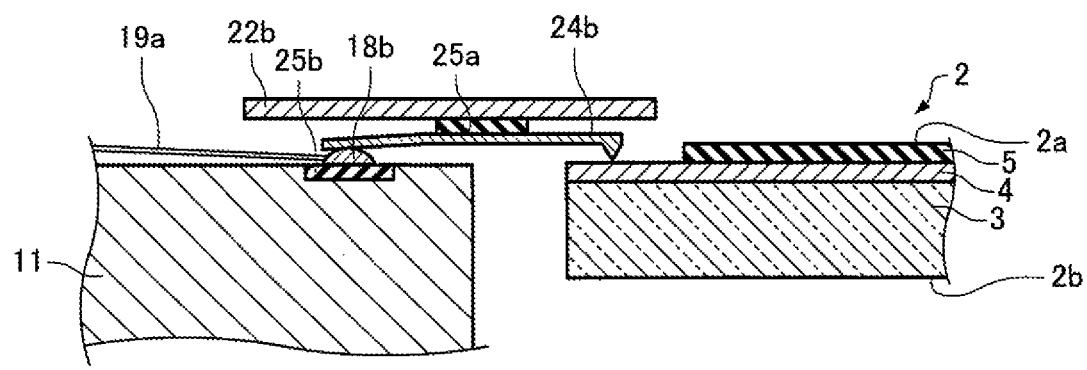

FIG. 8 is a schematic cross-sectional view of the substrate stage 10 and substrate cover 20, taken on line VIII-VIII of FIG. 2. When the second part 22b of the frame portion 22 is mounted over the substrate stage 10 as shown in FIG. 8, the conductive second pin 24b comes into contact with the top surface 2a of the substrate 2 and is electrically connected with the substrate 2.

When the second part 22b of the frame portion 22 is mounted over the substrate stage 10, the front end of the conductive second pin 24b comes into contact with the exposed, light shielding film layer 4 as shown in FIG. 8. The rear end of the conductive second pin 24b comes into contact with the terminal 18b. The second pin 24b is connected with the second part 22b of the frame portion 22 via an insulative member 25a. The terminal 18b is mounted on the base portion 11 via an insulating member 25b. The terminal 18b is connected with the detector 19 (see FIG. 2) via the wiring line 19a. Therefore, the conductive second pin 24b is electrically insulated from the substrate cover 20 and from the base portion 11, and is connected with the detector 19 via the terminal 18b and the wiring line 19a. This permits the detector 19 made of a resistance measuring device to detect that the substrate 2 is grounded.

In particular, when the conductive first pin 24a is electrically connected with the light shielding film layer 4 and the substrate 2 (light shielding film layer 4) is grounded, the resistance detected by the detector 19 is small. When the conductive first pin 24a is not electrically connected with the light shielding film layer 4 and the substrate 2 (light shielding film layer 4) is not grounded, the resistance detected by the detector 19 is large. Consequently, it is possible using the detector 19 to confirm that the substrate 2 (light shielding film layer 4) is grounded.

A switch (not shown) may be connected between the conductive second pin 24b and the detector 19 to make a switch between the connection of the conductive second pin 24b with the detector 19 and the connection of the conductive second pin 24b with chassis ground. This permits the substrate 2 (light shielding film layer 4) to be grounded using the conductive second pin 24b similarly to the conductive first pin 24a after checking that the substrate 2 is grounded.

Figure 9:
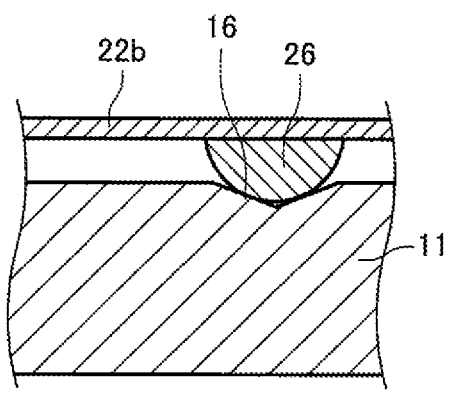
FIG. 9 is a schematic fragmentary cross-sectional view of a positioning device and a positioning groove of the charged-particle beam lithographic system shown in FIG. 1.

FIG. 9 is a schematic cross-sectional view of the positioning members 26 and positioning grooves 16, taken on line IX-IX of FIG. 2. FIG. 9 shows a state in which the second part 22b of the frame portion 22 is mounted over the substrate stage 10. The positioning members 26 are mounted under the second part 22b of the frame portion 22, and are semispherical in shape, for example. Since the positioning members 26 are placed in the positioning grooves 16 formed in the substrate stage 10 as shown in FIG. 9, the second part 22b of the frame portion 22 is mounted over the stage 10 such that the second part 22b becomes integral with the first part 22a. The positioning members 26 are plural (three in the illustrated example) in number. Where the positioning members 26 are made of an electrically conductive material, the second part 22b of the frame portion 22 can be grounded also via the positioning members 26.

Figure 10:
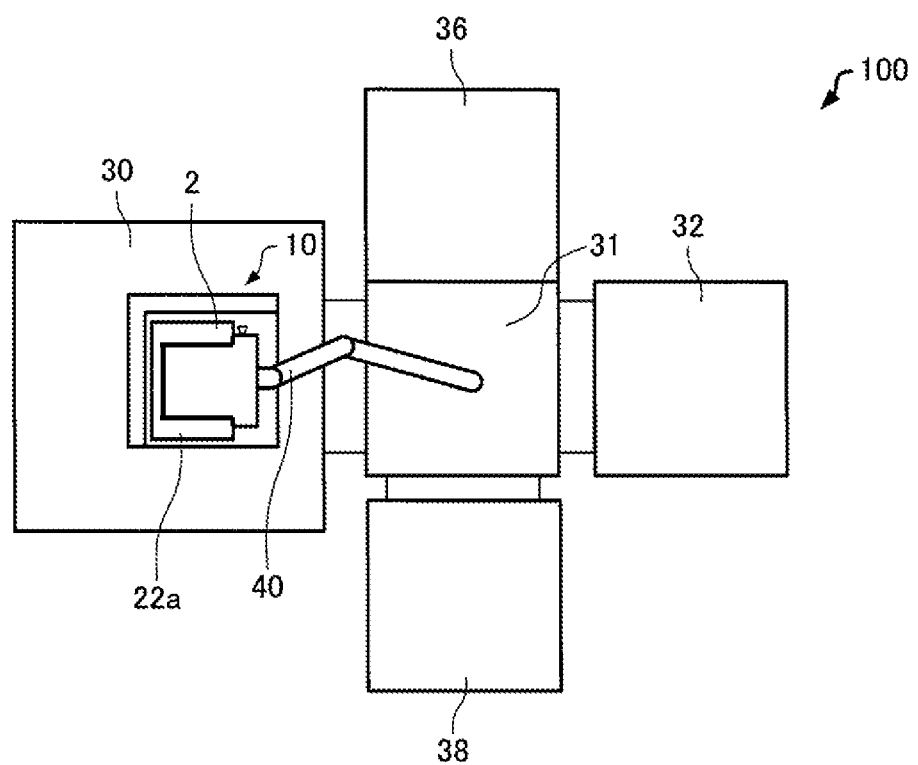
FIGS. 10 and 11 are schematic views of the charged-particle beam lithographic system shown in FIG. 1, showing its configuration.

FIG. 10 schematically shows the configuration of the charged-particle beam lithographic system 100. FIG. 10 shows a state in which the substrate 2 is mounted on the substrate stage 10 of the lithography chamber 30 by the transport portion 40. In FIG. 10, for the sake of convenience, the substrate stage 10 is shown in simplified form.

As shown in FIG. 10, the charged-particle beam lithographic system 100 has the lithography system 30, a transport chamber 31, an air lock chamber 32, an alignment chamber 36, and an exchange chamber 38.

The substrate stage 10 is mounted in the lithography chamber 30. The second part 22b of the frame portion 22 of the substrate cover 20 has been previously placed over the stage 10. The charged-particle beam lithographic system 100 has the electron optical column 100A (see FIG. 1) located above the lithography chamber 30. In the lithography chamber 30, a pattern is delineated on the substrate 2 by directing the electron beam L at the substrate 2 from the electron optical column 100A. A gate valve (not shown) is mounted between the lithography chamber 30 and the transport chamber 31.

The transport chamber 31 is located adjacent to the lithography chamber 30 and has the transport portion 40 which is a robot arm, for example. The substrate 2 and the second part 22b of the frame portion 22 are conveyed by the transport portion 40.

The air lock chamber 32 is adjacent to the transport chamber 31 on the opposite side of the lithography chamber 30. That is, the transport chamber 31 is located between the air lock chamber 32 and the lithography chamber 30. The substrate 2 and the second part 22b of the frame portion 22 can be conveyed between the system and the outside via the air lock chamber 32. A gate valve (not shown) is mounted between the air lock chamber 32 and the transport chamber 31.

The alignment chamber 36 is a space where the substrate 2 is placed in position. The alignment chamber 36 is located adjacent to the transport chamber 31. The exchange chamber 38 is a space for accommodating the second part 22b of the frame portion 22. The exchange chamber 38 is located adjacent to the transport chamber 31. The transport chamber 31 is positioned between the alignment chamber 36 and the exchange chamber 38.

A method of mounting the substrate 2 on the substrate stage 10 after conveying the substrate into the lithography chamber 30 from the outside is described below. The substrate 2 is introduced into the air lock chamber 32 from the outside. Then, the interior of the air lock chamber 32 is evacuated, and the gate valve between the air lock chamber 32 and the transport chamber 31 is opened. The substrate 2 is conveyed into the alignment chamber 36 from the air lock chamber 32 by the transport portion 40 made of a robot arm. In the alignment chamber 36, the substrate 2 is placed in position and then the gate valve between the transport chamber 31 and the lithography chamber 30 is opened. The substrate 2 is conveyed from the alignment chamber 36 into the lithography chamber 30 by the transport portion 40 made of a robot arm. The substrate 2 is secured on the stage 10 by the clamping portions 14 (see FIGS. 2-4).

When the substrate 2 is taken out of the substrate stage 10 and conveyed to the outside, the above-described procedure consisting of conveying the substrate 2 from the outside into the lithography chamber 30 and loading the substrate on the stage 10 is carried out in the reverse order.

Figure 11:
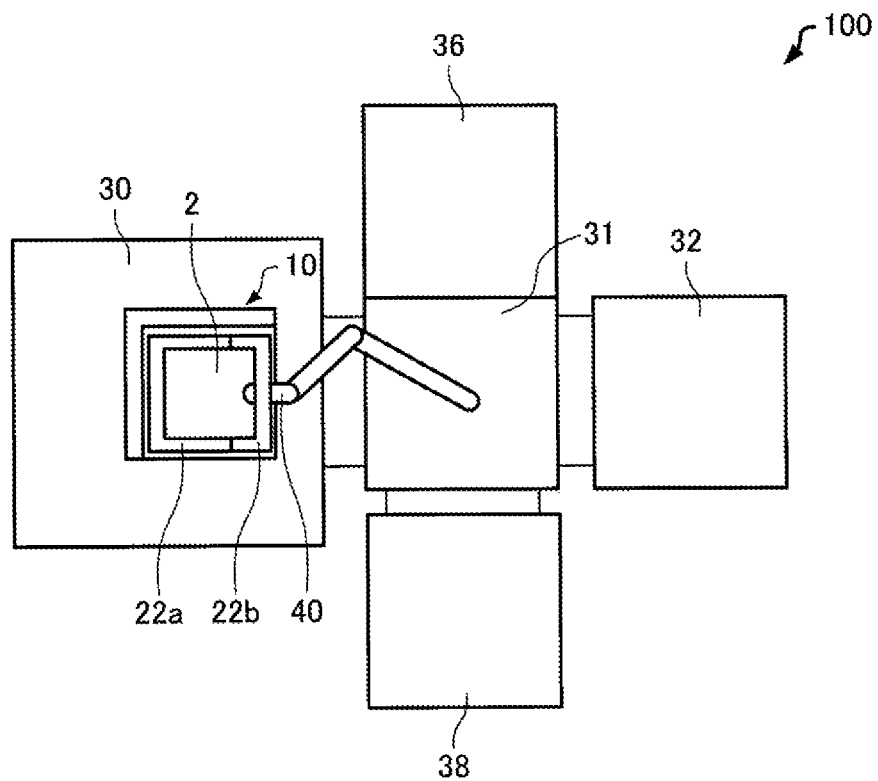

FIG. 11 schematically shows the configuration of the charged-particle beam lithographic system 100. FIG. 11 shows a state in which the second part 22b of the frame portion 22 has been mounted over the substrate stage 10 of the lithography chamber 30 by the transport portion 40. In FIG. 11, for the sake of convenience, the stage is shown in simplified form.

The second part 22b of the frame portion 22 is introduced into the air lock chamber 32 from the outside. Then, the interior of the air lock chamber 32 is evacuated, and the gate valve between the air lock chamber 32 and the transport chamber 31 is opened. The second part 22b of the frame portion 22 is conveyed from the air lock chamber 32 into the exchange chamber 38 by the transport portion 40 made of a robot arm. The conveyance of the second part 22b from the outside into the exchange chamber 38 may be effected before the substrate 2 is mounted on the substrate stage 10. That is, before the substrate 2 is mounted on the stage 10, the second part 22b of the frame portion 22 may be received in the exchange chamber 38. Furthermore, the conveyance of the second part 22b from the outside into the exchange chamber 38 may be carried out after the substrate 2 is mounted on the stage 10.

The second part 22b of the frame portion 22 is conveyed from the exchange chamber 38 into the lithography chamber 30 by the transport portion 40 made of a robot arm after the gate valve between the transport chamber 31 and the lithography chamber 30 is opened. The second part 22b of the frame portion 22 is mounted over the stage 10 by the transport portion 40 such that the second part 22b becomes integral with the first part 22a of the frame portion 22 of the substrate cover 20. In particular, the second part 22b of the frame portion 22 is placed over the stage 10 by the transport portion 40 such that the positioning members 26 for the second part 22b are placed in the positioning grooves 16 of the stage 10.

After the substrate 2 and the second part 22b of the frame portion 22 are placed over the substrate stage 10 in this way, lithographic delineation on the substrate 2 is started. When the delineation is complete and the substrate 2 is taken out, a procedure reverse to the procedure performed when the substrate is loaded is carried out. That is, the second part 22b of the frame portion 22 is detached from the stage 10 by the transport portion 40 and the substrate 2 is removed from the stage 10 through the space formed by the detachment and conveyed to the outside by the transport portion 40. If the second part 22b of the frame portion 22 does not hinder removal of the substrate 2, it is not necessary to remove the second part 22b of the frame portion 22.

The charged-particle beam lithographic system 100 has the following features. In the lithographic system 100, the substrate cover 20 has the frame portion 22 that covers the outer peripheral portion of the substrate 2 disposed over the substrate stage 10 as viewed within a plane. Therefore, in this lithographic system 100, when delineation is performed using the electron beam L, the side surface of the substrate 2 (glass base plate 3) can be shielded against the electron beam L. This can suppress electrification of the substrate 2. Consequently, in the lithographic system 100, when a pattern is written on the substrate 2 by irradiating the substrate with the beam L, deviation of the orbit of the electron beam L can be suppressed.

In the charged-particle beam lithographic system 100, the frame portion 22 has the first part 22a placed over the substrate stage 10 and the second part 22b capable of being loaded and unloaded to and from the stage 10. The second part 22b is loaded and unloaded by the transport portion 40. Therefore, in the lithographic system 100, the frame portion 22 can be loaded and unloaded with greater ease than where the whole frame portion 22 is loaded and unloaded, for example, by the transport portion 40. Consequently, in the lithographic system 100, the frame portion 22 of the substrate cover 20 can be loaded and unloaded in a reduced time. Hence, the productivity can be enhanced.

In the charged-particle beam lithographic system 100, the conductive first pin 24a that makes mechanical and electrical contact with the substrate 2 is mounted on the second part 22b of the frame portion 22. The substrate 2 is electrically connected with the conductive first pin 24a and grounded. Therefore, in the lithographic system 100, electrification of the substrate 2 (light shielding film layer 4) can be suppressed. Accordingly, in the lithographic system 100, when a pattern is delineated on the substrate 2 by directing the electron beam L at the substrate, deviation of the orbit of the beam L can be suppressed.

Furthermore, in the charged-particle beam lithographic system 100, the second part 22b of the frame portion 22 of the substrate cover 20 can be easily detached from the substrate stage 10 by the transport portion 40 and so dust adhering on the conductive first pin 24a can be easily removed by conveying the second part 22b of the frame portion 22 out of the system and rubbing the conductive first pin 24a against the substrate 2. Consequently, the lithographic system 100 can provide improved productivity. In addition, in the lithographic system 100, more second parts of the frame portion 22 can be accommodated in the exchange chamber 38 as compared with the case where the whole frame portion 22 is received in the exchange chamber 38.

In the charged-particle beam lithographic system 100, the conductive second pin 24b that makes mechanical and electrical contact with the substrate 2 is mounted to the second part 22b of the frame portion 22. The conductive second pin 24b is connected with the detector 19 that is used to detect that the substrate 2 is grounded. Therefore, with the lithographic system 100, it is easy to check that the substrate 2 is grounded. Moreover, in the lithographic system 100, the conductive second pin 24b is mounted to the second part 22b of the frame portion 22 and so dust adhering to the conductive second pin 24b can be easily removed by rubbing the conductive second pin 24b against the substrate 2 in the same way as for the above-described conductive first pin 24a.

In the charged-particle beam lithographic system 100, the clamping portions 14 for holding the substrate 2 are mounted on the substrate stage 10. The clamping portions 14 push against the substrate 2 from a side of the lower surface 2b. The clamping portions 14 are plural in number. The conductive first and second pins 24a, 24b are so positioned that the distance between any one of the pins 24a, 24b and the first clamping portion 14a out of the plural clamping portions 14a, 14b, 14c is smaller than the distance between any one of the pins 24a, 24b and any one of the other clamping portions 14b and 14c. Taking account of the pushing forces of the conductive first and second pins 24a, 24b, the first clamping portion 14a applies a greater force to the substrate 2 than the other clamping portions 14b and 14c. Therefore, in the charged-particle beam lithographic system 100, the forces applied to the substrate 2 can be made more uniform than where the pushing forces of the plural clamping portions 14a, 14b, and 14c are equal. This can suppress flexure of the substrate 2.

1.3. Modification

Figure 12:
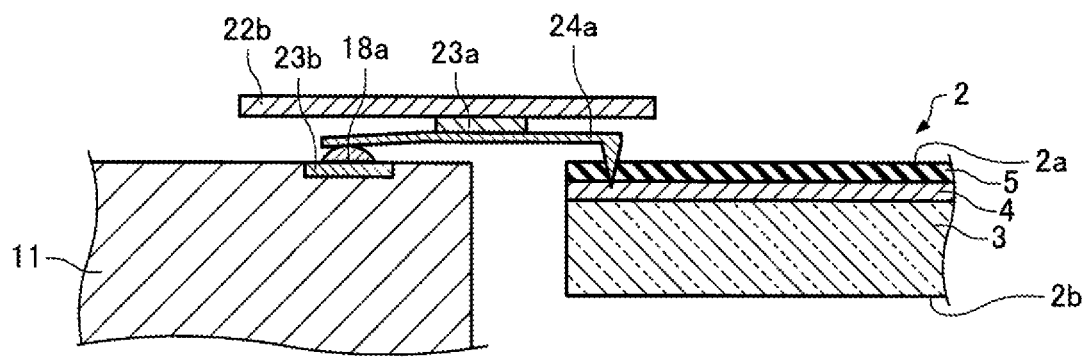
FIGS. 12 and 13 are schematic fragmentary cross-sectional views of the substrate stage and substrate cover of a charged-particle beam lithographic system associated with a modification of the first embodiment.
Figure 13:
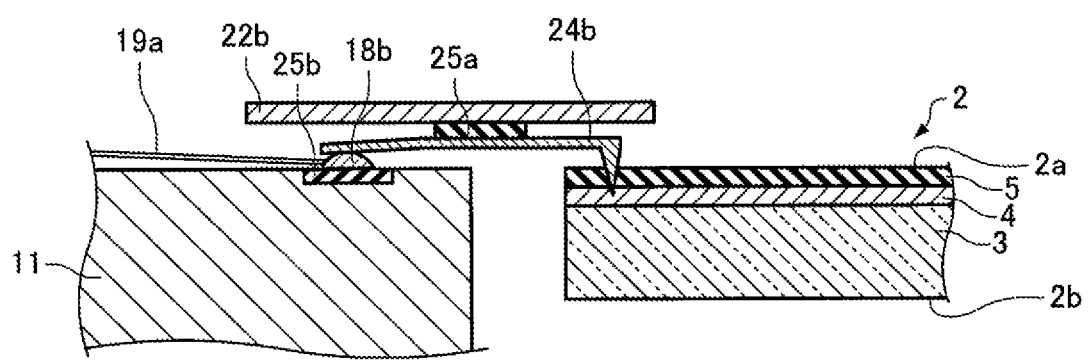

A modification of the charged-particle beam lithographic system of the first embodiment is next described. FIGS. 12 and 13 are schematic cross-sectional views of the substrate stage 10 and the substrate cover 20 of a charged-particle beam lithographic system associated with the present modification. FIGS. 12 and 13 correspond to FIGS. 7 and 8, respectively. In FIGS. 12 and 13, those components of these stage 10 and cover 20 which are similar in function to their respective counterparts of the charged-particle beam lithographic system 100 associated with the first embodiment are indicated by the same reference numerals as in the above cited figures.

The charged-particle beam lithographic system associated with the present modification is similar to the charged-particle beam lithographic system 100 associated with the first embodiment except that the substrate cover 20 shown in FIGS. 12 and 13 are different in configuration. Therefore, only the differences with the lithographic system 100 are described below.

As shown in FIGS. 12 and 13, the resist layer 5 is formed over the outer peripheral portion of the substrate 2. That is, the light shielding film layer 4 and resist layer 5 are formed over the whole surface of the glass base plate 3 of the substrate 2. Therefore, in order to make electrical connection with the light shielding film layer 4, the conductive first pin 24a and the conductive second pin 24b must pierce through the resist layer 5 and make contact with the light shielding film layer 4.

Therefore, in the present modification, as shown in FIGS. 12 and 13, the conductive first and second pins 24a and 24b, respectively, have sharpened front end portions. The front end portions of the first and second pins 24a and 24b can pierce through the resist layer 5 and make contact with the light shielding film layer 4.

In the charged-particle beam lithographic system associated with the present modification, the conductive pins 24a and 24b are stuck through the resist layer 5 and, therefore, when the second part 22b of the frame portion 22 is removed during later exchange of the substrate 2, the resist layer 5 partly adheres to the conductive pins 24a and 24b. This may produce dust. In the charged-particle beam lithographic system associated with the present modification, the second part 22b of the frame portion 22 can be easily detached from the substrate stage 10 easily by the transport portion 40 in the same way as in the charged-particle beam lithographic system 100. As a consequence, dust produced by adhesion of parts of the resist layer 5 to the conductive pins 24a and 24b can be easily removed.

The shape of the front end portions of the conductive pins 24a and 24b are not restricted to the above example. Rather, various shapes can be assumed according to application. For example, the conductive pins 24a and 24b may have rounded (such as semispherical) front end portions in an unillustrated manner. Thus, where the light shielding film layer 4 is exposed over the outer peripheral portion of the substrate 2 as shown in FIGS. 7 and 8, it is possible to prevent the conductive pins 24a and 24b from piercing through the light shielding film layer 4.

Figure 14:
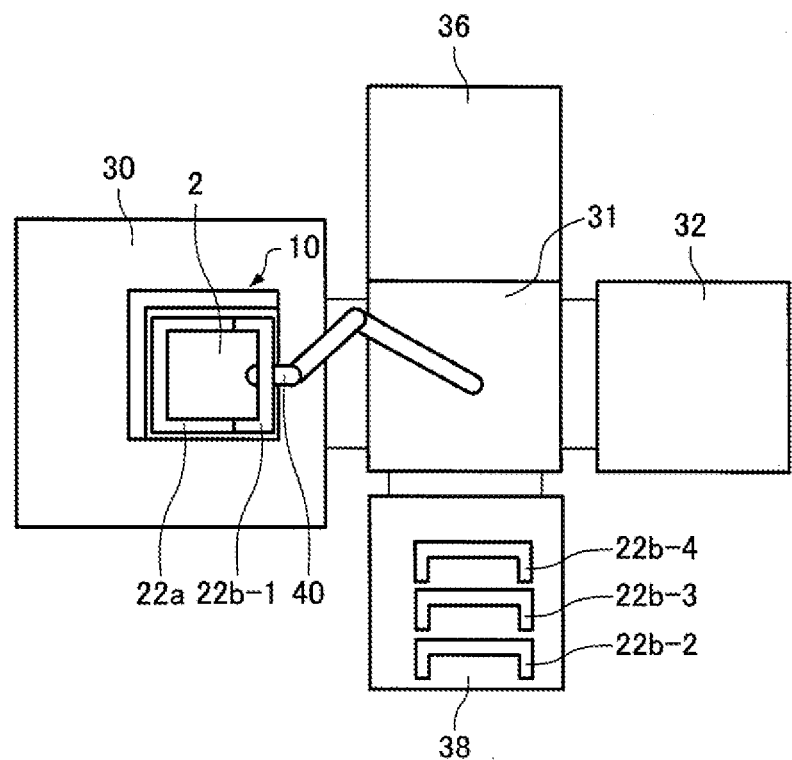
FIG. 14 is a schematic view of the charged-particle beam lithographic system associated with the first embodiment, showing its configuration.

FIG. 14, which corresponds to FIG. 11, schematically shows the configuration of the charged-particle beam lithographic system associated with the present modification. In the charged-particle beam lithographic system associated with the present modification, a pair of conductive pins 24a and 24b having front end portions of a different shape is mounted to each different one of the second parts 22b-1, 22b-2, 22b-3, and 22b-4 of the plural frame portions 22. As shown in FIG. 14, the second parts 22b-2, 22b-3, and 22b-4 are received in the exchange chamber 38, while the second part 22b-1 is received in the lithography chamber 30. Therefore, in this lithographic system, an optimum pair of conductive pins 24a, 24b can be selected from the four pairs of conductive pins 24a and 24b according to the layer structure of the substrate 2. Also, it is easy to exchange the conductive pins 24a and 24b.

2. Second Embodiment

Figure 15:
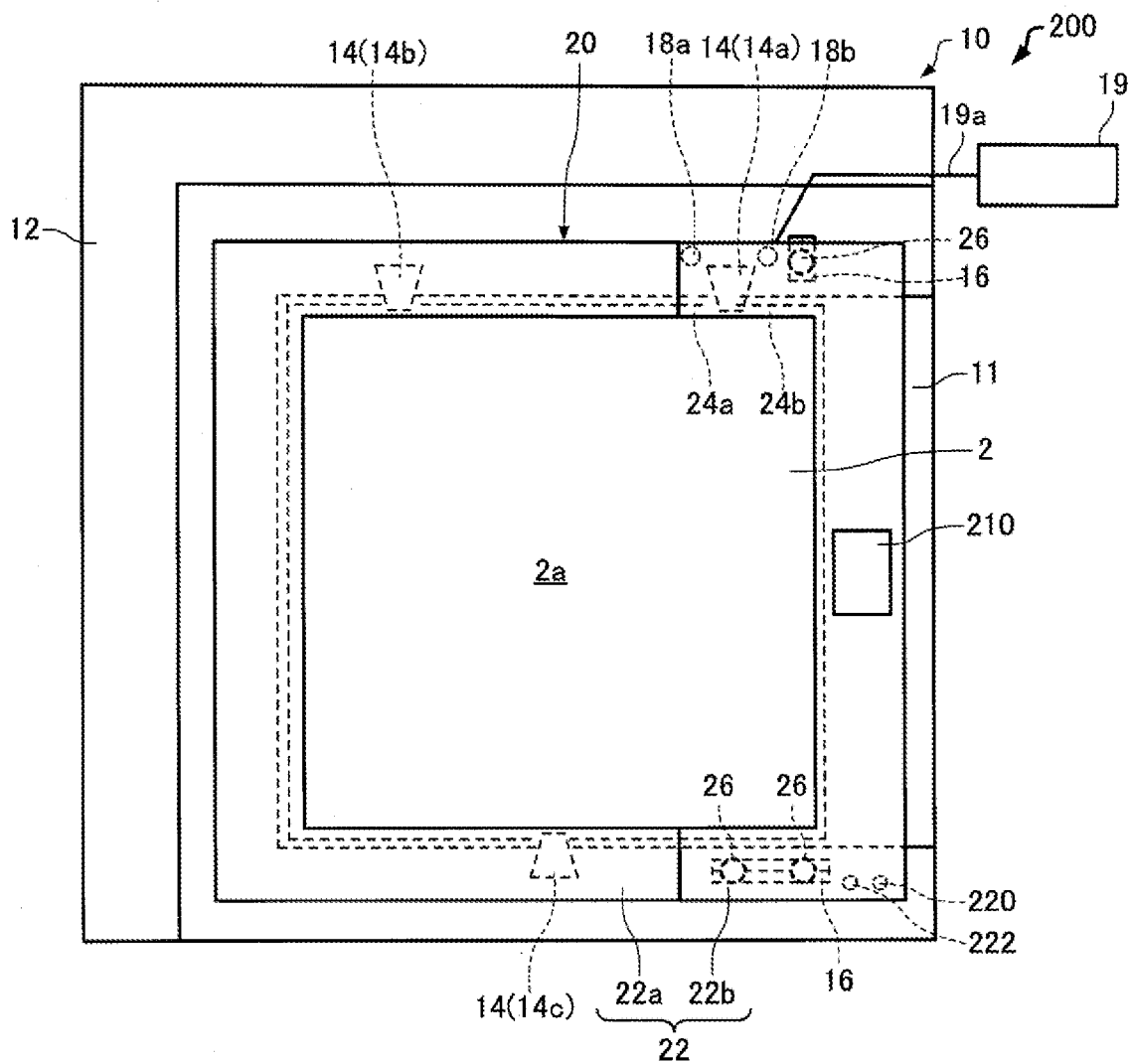
FIGS. 15 and 16 are schematic plan views of the substrate stage and substrate cover of a charged-particle beam lithographic system associated with a second embodiment.
Figure 16:
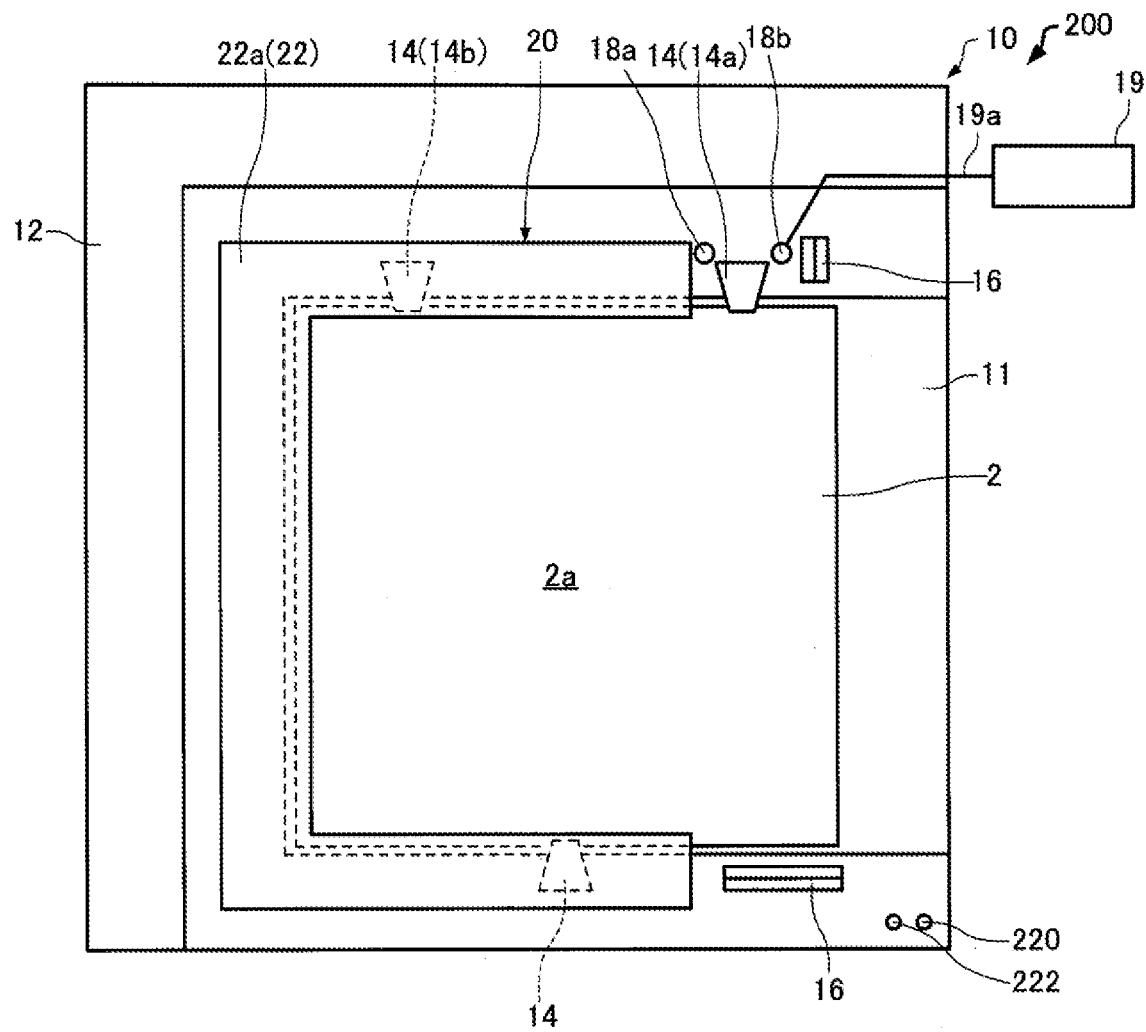

A charged-particle beam lithographic system associated with a second embodiment of the present invention is next described by referring to FIGS. 15 and 16, which are schematic plan views of the substrate stage 10 and the substrate cover 20 of this charged-particle beam lithographic system, 200. FIG. 15 shows a state in which the second part 22b of the frame portion 22 has been mounted over the stage 10. FIG. 16 shows a state in which the second part 22b of the frame portion 22 has been taken out of the stage 10.

Figure 17:
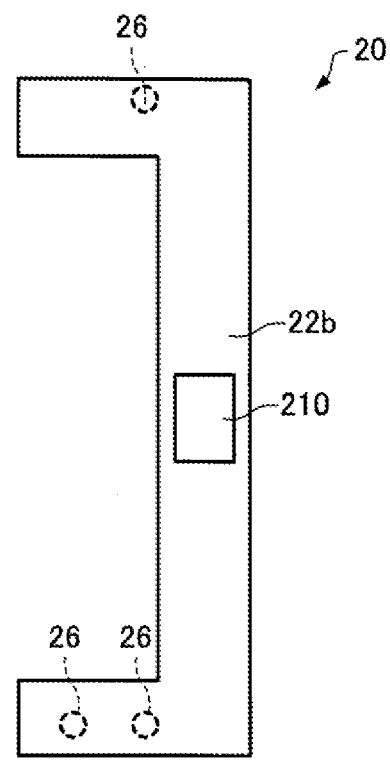
FIG. 17 is a schematic plan view of a second part of a frame portion of the substrate cover of the charged-particle beam lithographic system shown in FIGS. 15 and 16.
Figure 18:
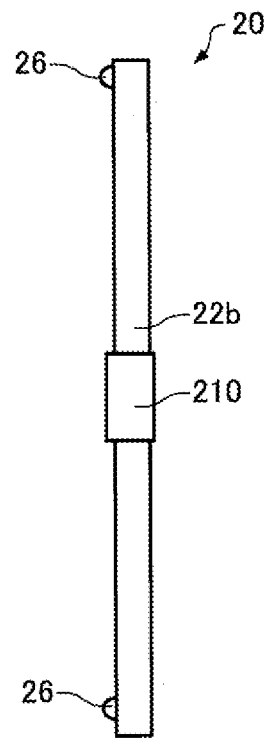
FIG. 18 is a schematic side elevation of the second part of the frame portion shown in FIG. 17.

FIG. 17 is a schematic plan view of the second part 22b of the frame portion 22. FIG. 18 is a schematic side elevation of the second part 22b of the frame portion 22. For the sake of convenience, a vibratory portion 210 is shown in simplified form in FIGS. 15, 17, and 18. In FIGS. 15-18, those components of the charged-particle beam lithographic system 200 which are similar in function to their respective counterparts of the above-described charged-particle beam lithographic system 100 associated with the first embodiment are indicated by the same reference numerals as in the above cited figures.

In the charged-particle beam lithographic system 200 associated with the second embodiment, the substrate stage 10 and substrate cover 20 shown in FIGS. 15-18 are only different in configuration from their counterparts of the charged-particle beam lithographic system 100. Therefore, only the differences with the charged-particle beam lithographic system 100 are described below.

In the charged-particle beam lithographic system 200, the second part 22b of the frame portion 22 has the vibratory portion 210 for vibrating the second part 22b as shown in FIGS. 15-18. A terminal (not shown) supplied with electric power from the outside is mounted on the underside. The base portion 11 has power supply terminals 220 and 222 for supplying current or voltage to the vibratory portion 210 at positions where a contact is made with terminals mounted on the second part 22b of the frame portion 22. When the second part 22b of the frame portion 22 is mounted over the substrate stage 10, electrical current is supplied from the power supply terminals 220 and 222 to the vibratory portion 210, causing it to vibrate. In the illustrated example, no conductive pin is mounted on the second part 22b of the frame portion 22.

Figure 19:
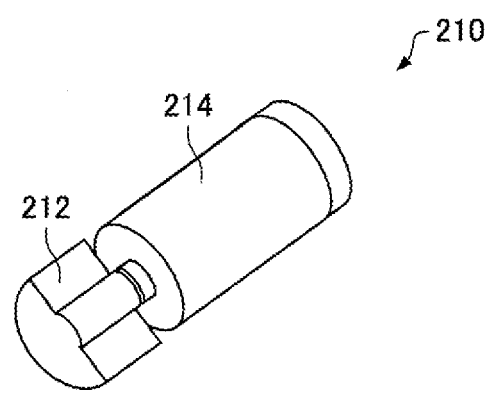
FIG. 19 is a schematic perspective view of the vibratory portion of the substrate cover shown in FIG. 18.

FIG. 19 is a schematic perspective view of the vibratory portion 210 of the substrate cover 20 of the charged-particle beam lithographic system 200. As shown in FIG. 19, the vibratory portion 210 is configured including an eccentric weight 212 and a motor 214 for rotating the weight 212. Since the motor 214 rotates the eccentric weight 212, the second part 22b of the frame portion 22 can be vibrated.

Figure 20:
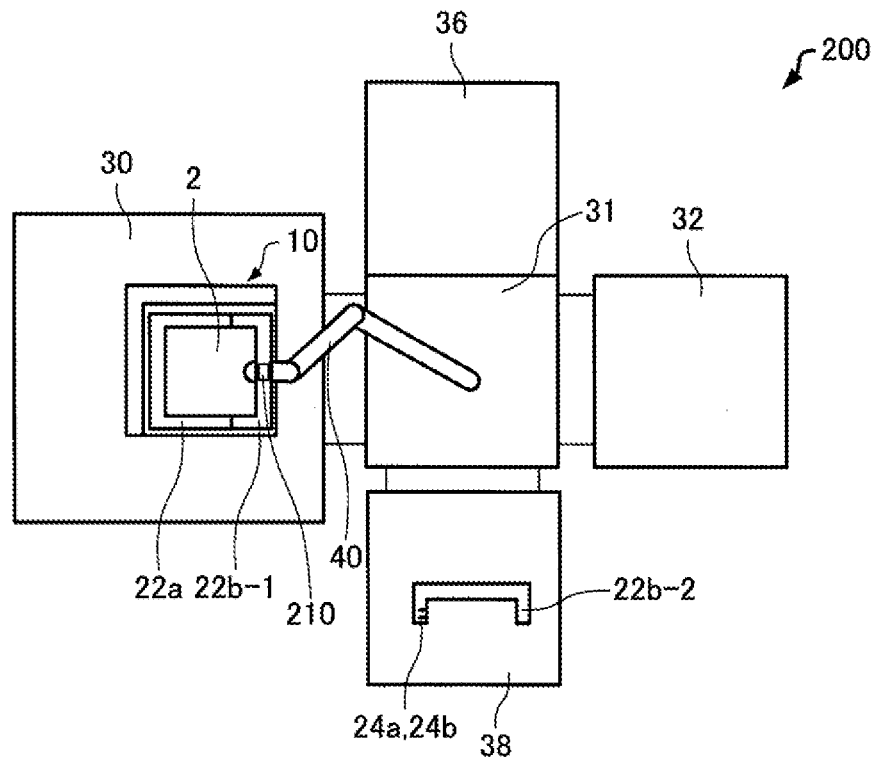
FIG. 20 is a schematic view of the charged-particle beam lithographic system shown in FIGS. 15 and 16, showing the configuration of the system.

A method of using the second part 22b of the frame portion 22 having the vibratory portion 210 is next described. FIG. 20, which corresponds to FIG. 11, schematically shows the configuration of the charged-particle beam lithographic system 200.

As shown in FIG. 20, the second part 22b-1 of the frame portion 22 having the vibratory portion 210 and the second part 22b-2 (see, for example, FIGS. 5 and 6) of a frame portion 22 having the conductive pins 24a and 24b are conveyed into the exchange chamber 38 from the outside.

After the substrate 2 is mounted over the substrate stage 10, the second part 22b-1 having the vibratory portion 210 received in the exchange chamber 38 is transported from the exchange chamber 38 into the lithography chamber 30 by the transport portion 40 made of a robot arm. The second part 22b-1 having the vibratory portion 210 is mounted on the stage 10 by the transport portion 40 so as to become integral with the first part 22a of the frame portion 22. At this time, electric power is supplied from the power supply terminals 220 and 222 (see FIG. 16) mounted on the base portion 11 to the vibratory portion 210, thus vibrating the second part 22b-1. The vibrations are transmitted to the clamping portions 14 (more specifically, to the upper member 141 and lower member 142 of each clamping portion 14 as shown in FIG. 4). This can reduce the residual stress between the clamping portions 14 and the substrate 2.

Then, the second part 22b-1 is removed from the substrate stage 10 by the transport portion 40 and conveyed from the lithography chamber 30 into the exchange chamber 38. Subsequently, the second part 22b-2 having the conductive pins 24a and 24b is transported from the exchange chamber 38 into the lithography chamber 30 by the transport portion 40 and mounted on the stage 10.

In this way, in the charged-particle beam lithographic system 200, when a pattern is delineated on the substrate 2 by directing the electron beam L at the substrate, the second part 22b-2 of the frame portion 22 having the conductive pins 24a and 24b is used and so the effects of the magnetic field produced by the motor 214 on the electron beam L can be eliminated.

The charged-particle beam lithographic system 200 has the following features. In the lithographic system 200, the second part 22b of the frame portion 22 has the vibratory portion 210 for vibrating the second part 22b. Therefore, in the lithographic system 200, the residual stress between each clamping portion 14 and the substrate 2 can be reduced. Consequently, on the stage 10, positional deviation of the substrate 2 can be suppressed. As a result, in the lithographic system 200, positional deviation of the substrate 2 can be suppressed. This can lead to improved productivity.

In the charged-particle beam lithographic system 200, the vibratory portion 210 has the eccentric weight 212 and the motor 214 for rotating the weight 212. Consequently, the second part 22b can be vibrated.

3. Third Embodiment

Figure 21:
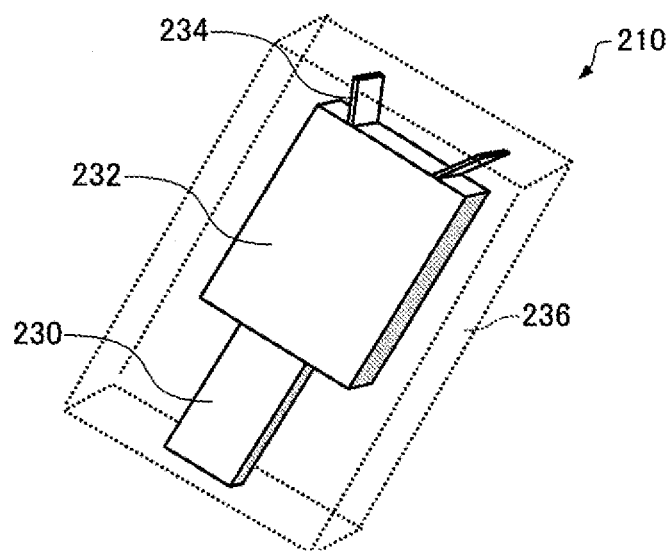
FIG. 21 is a schematic perspective view of a vibratory portion of a charged-particle beam lithographic system associated with a third embodiment.

A charged-particle beam lithographic system associated with a third embodiment is next described by referring to FIG. 21, which schematically shows the vibratory portion 210 of the system. In FIG. 21, for the sake of convenience, a case 236 is shown to be transparentized.

The charged-particle beam lithographic system associated with the third embodiment is similar in configuration to the charged-particle beam lithographic system 200 except that the vibratory portion 210 shown in FIG. 21 is different in configuration. Therefore, only the differences with the charged-particle beam lithography system 200 are described below.

In the charged-particle beam lithographic system 200, the vibratory portion 210 vibrates the second part 22b of the frame portion 22 by rotating the eccentric weight 212 using the motor 214 as shown in FIG. 19.

On the other hand, in the charged-particle beam lithographic system associated with the third embodiment, the vibratory portion 210 has a piezoelectric device 230, a weight 232, leaf springs 234, and the case 236 as shown in FIG. 21. The second part 22b is being vibrated by vibrations of the piezoelectric device 230.

In particular, when the second part 22b of the frame portion 22 is mounted over the substrate stage 10, a voltage is applied to the piezoelectric device 230 from the power supply terminals 220 and 222 (see FIG. 16) to vibrate (i.e., expand and contract) the piezoelectric device 230. The vibrations of the piezoelectric device 230 are transmitted to the weight 232 and to the leaf springs 234, vibrating the second part 22b. The case 236 houses the piezoelectric device 230, weight 232, and leaf springs 234.

In the charged-particle beam lithographic system associated with the third embodiment, the vibratory portion 210 has the piezoelectric device 230. Therefore, this lithographic system can reduce the residual stress between the clamping portions 14 and the substrate 2 in the same way as for the charged-particle beam lithographic system 200.

4. Fourth Embodiment

Figure 22:
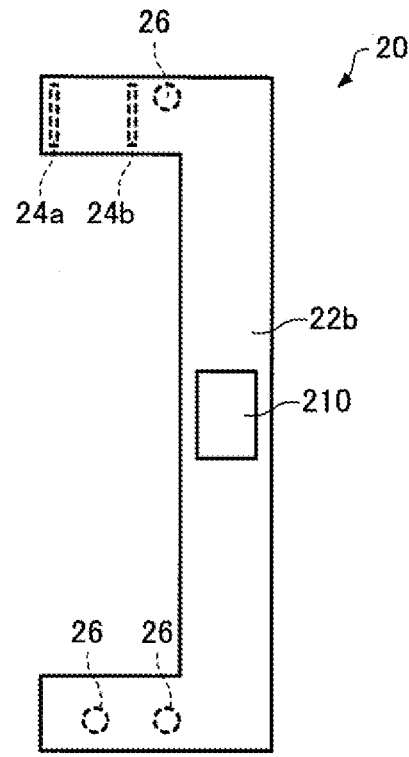
FIG. 22 is a schematic plan view of a second part of a frame portion of a substrate cover of a charged-particle beam lithographic system associated with a fourth embodiment.
Figure 23:
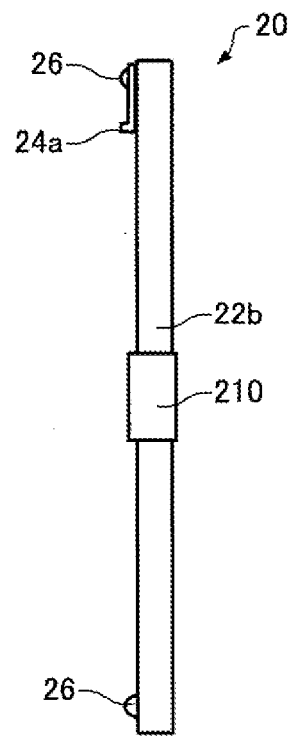
FIG. 23 is a schematic side elevation of the frame portion shown in FIG. 22.

A charged-particle beam lithographic system associated with a fourth embodiment is next described by referring to FIGS. 22 and 23. FIG. 22 is a schematic plan view of the second part 22b of the frame portion 22 of this lithographic system. FIG. 23 is a schematic side elevation of the second part 22b of the frame portion 22 of this lithographic system. For the sake of convenience, in FIGS. 22 and 23, the vibratory portion 210 is shown in simplified form. In FIGS. 22 and 23, those components of this lithographic system which are similar in function to their respective counterparts of the above-described charged-particle beam lithographic systems 100, 200, and 300 are indicated by the same references as in the above cited figures.

The charged-particle beam lithographic system associated with the fourth embodiment is similar to the above-described charged-particle beam lithographic system 200 except that the substrate stage 10 and substrate cover 20 shown in FIGS. 22 and 23 are different in configuration from those of the lithographic system 200. Therefore, only the differences with the lithographic system 200 are described below.

In the charged-particle beam lithographic system 200, as shown in FIGS. 17 and 18, the vibratory portion 210 is mounted to the second part 22b of the frame portion 22 but the conductive pins 24a and 24b are not mounted.

On the other hand, in the charged-particle beam lithographic system associated with the fourth embodiment, as shown in FIGS. 22 and 23, the second part 22b of the frame portion 22 has a vibratory portion 210 and conductive pins 24a, 24b. Consequently, vibration of the second part 22b and grounding of the substrate 2 via the conductive pins 24a, 24b can be carried out by one second part 22b.

In the charged-particle beam lithographic system associated with the fourth embodiment, the vibratory portion 210 preferably includes a piezoelectric device 230 shown in FIG. 21. Thus, the produced magnetic field can be made weaker than where a vibratory portion uses a motor. Consequently, in the charged-particle beam lithographic system associated with the fourth embodiment, deviation of the orbit of the electron beam L due to the magnetic field can be suppressed.

It is to be understood that the above-described embodiments are merely exemplary and that the present invention is not restricted thereto. For example, the embodiments and modification may be appropriately combined.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described our invention with the detail and particularity required by the Patent Laws, what is desired protected by Letters Patent is set forth in the following claims.

The invention claimed is:

1. A charged-particle beam lithographic system for delineating a pattern on a substrate by directing a charged particle beam at the substrate, said charged-particle beam lithographic system comprising:
   a substrate stage on which the substrate is placed; and
   a substrate cover having a frame portion that covers an outer peripheral portion of the substrate as viewed within a plane,
   wherein the frame portion has a first part disposed on the substrate stage and a second part capable of being loaded and unloaded on and from the substrate stage by a transport portion; and
   wherein the second part is electrically grounded when loaded on the substrate stage.

2. The charged-particle beam lithographic system as set forth in claim 1, wherein a conductive first pin that makes mechanical and electrical contact with said substrate is mounted on said second part, and wherein the substrate is electrically connected with the conductive first pin and grounded.

3. The charged-particle beam lithographic system as set forth in claim 2, wherein a conductive second pin that makes mechanical and electrical contact with said substrate is mounted on said second part and electrically insulated from the second part, and wherein the conductive second pin is connected with a detector that detects that the substrate is electrically grounded.

4. The charged-particle beam lithographic system as set forth in claim 2,
   wherein said substrate has a first surface with which said conductive first pin makes contact and a second surface facing away from the first surface;
   wherein plural clamping portions for holding the substrate are mounted on said substrate stage, the clamping portions pushing against the substrate from a side of the second surface,
   wherein said conductive first pin is so placed that the distance between this first pin and a first one of the plural clamping portions is smaller than the distance between the first pin and each of the other clamping portions; and
   wherein said first clamping portion applies a greater pushing force to the substrate than the other clamping portions.

5. The charged-particle beam lithographic system as set forth in claim wherein said second part has a vibratory portion for vibrating the second part.

6. The charged-particle beam lithographic system as set forth in claim 5, wherein said vibratory portion has an eccentric weight and a motor for rotating the weight.

7. The charged-particle beam lithographic system as set forth in claim 5, wherein said vibratory portion has a piezoelectric device.

* * * * *